United States Patent
Zhang et al.

(10) Patent No.: US 7,579,910 B2
(45) Date of Patent: Aug. 25, 2009

(54) LOW DISTORTION SWITCHING AMPLIFIER CIRCUITS AND METHODS

(75) Inventors: Wolf Zhang, Shanghai (CN); Hideto Takagishi, San Jose, CA (US); Alan Wu, Shanghai (CN)

(73) Assignee: PacificTech Microelectronics, Inc., Grand Cayman (KY)

( * ) Notice: Subject to any disclaimer, the term of this patent is extended or adjusted under 35 U.S.C. 154(b) by 0 days.

(21) Appl. No.: 11/968,379

(22) Filed: Jan. 2, 2008

(65) Prior Publication Data
US 2008/0174366 A1    Jul. 24, 2008

Related U.S. Application Data

(60) Provisional application No. 60/878,227, filed on Jan. 3, 2007.

(51) Int. Cl.
*H03F 3/217* (2006.01)
(52) U.S. Cl. .................. 330/251; 330/10; 330/207 A
(58) Field of Classification Search .............. 330/251, 330/10, 207 A
See application file for complete search history.

(56) References Cited

U.S. PATENT DOCUMENTS

| | | | | |
|---|---|---|---|---|
| 6,693,571 B2 * | 2/2004 | Melanson et al. | ............ | 341/143 |
| 6,762,704 B1 * | 7/2004 | Melanson et al. | ............ | 341/143 |
| 6,917,324 B2 * | 7/2005 | Lee | ...................... | 341/155 |
| 7,262,658 B2 * | 8/2007 | Ramaswamy et al. | ........ | 330/251 |
| 7,378,904 B2 * | 5/2008 | Risbo | ........................ | 330/10 |
| 7,482,870 B2 * | 1/2009 | Maejima et al. | ........... | 330/207 P |
| 2006/0181346 A1 * | 8/2006 | Nguyen | ...................... | 330/251 |

* cited by examiner

*Primary Examiner*—Patricia Nguyen
(74) *Attorney, Agent, or Firm*—Chad R. Walsh; Fountainhead Law Group PC

(57) ABSTRACT

Embodiments of the present invention include switching amplifier circuits and methods. In one embodiment, the present invention includes an low distortion method of driving a switching amplifier comprising generating a first pulse width modulated signal on a first terminal, generating a second pulse width modulated signal on a second terminal, and delaying one of the first or second signals. In one embodiment, the modulated signals and delay result in pulse trains near zero crossings to reduce crossover distortion.

19 Claims, 6 Drawing Sheets

LOW DISTORTION SWITCHING AMPLIFIER CIRCUITS AND METHODS

CROSS REFERENCE TO RELATED APPLICATIONS

This application claims priority to U.S. Provisional Application No. 60/878,227 entitled "Low Distortion Switching Amplifier Circuits and Methods," filed Jan. 3, 2007.

BACKGROUND

The present invention relates to amplifiers, and in particular, switching amplifier circuits and methods.

A switching amplifier, sometimes referred to as a class D amplifier, is an amplifier where the output transistors are operated as switches. One example of a transistor used in switching amplifiers is a MOSFET. When the transistor is off, the circuit behaves like an open circuit so the current is zero. When the transistor is on, the voltage across the transistor is ideally zero. In practice, the voltage is very small. Since the equation for power is P=V*I, the power dissipated by the amplifier is very low in both states. This increases the efficiency, thus requiring less power from the power supply and allowing smaller heat sinks for the amplifier, for example. The increased efficiency translates into benefits such as longer battery life. The decrease in the size of the heat sinks lowers the weight, cost, and size of the amplifier. Example applications where these advantages would be useful are portable battery-powered equipment such as cellular technology or portable music players.

FIG. 1 illustrates a signal received by a switching amplifier. A continuous input signal is received by a modulator 101 and converted into a train of pulses. The input signal is transformed into a stream of pulses where the pulse characteristics are linked to the amplitude of the input signal. For example, within each period, the duty cycle of a pulse may be proportional to the amplitude of the input signal. For instance, if the input signal received is constant at zero, the duty cycle of the output pulses may be 50%. If the input signal received is highly positive, the duty cycle of the output pulses may be near 100%. Conversely, if the input signal received is highly negative, the duty cycle may be near 0%.

The modulated signal is then amplified in a switching output stage 102. Since the modulated signal is represented by a train of pulses, the output transistors operate like switches. This enables the transistors to have zero current when they are not switching and a low voltage drop across the transistors when they are switching.

The amplified signal generated by output stage 102 then enters a low pass filter 103 before entering a speaker 104. The low pass filter translates the modified amplified signal back into a continuous signal. A typical filter is an LC filter, for example. The resulting amplified continuous signal may be provided to a speaker and translated into sound. The benefits of low pass filters include minimizing electromagnetic interference ("EMI") and power dissipation in the amplified signal.

However, one disadvantage of switching amplifiers is the crossover distortion that may appear in signals transmitted from the amplification stage. For example, crossover distortion in a differential system with the center point at zero volts will occur when the differential signal transitions from positive to negative voltages. However, the crossover point may occur at any voltage depending on system design. FIG. 2 illustrates waveforms within a traditional switching amplifier. The input sinusoidal waveform is shown on plot 210. The crossover point in this example is the zero crossing of the sine wave is at 211. The peak of the sine wave, +v, is at 212 and the trough of the sine wave, -v, is at 213. Thus, the zero crossing is the transition point where the input signal transitions from a negative region of 0 to -v to a positive region of 0 to +v, or vice versa. Small signal pulses generated from modulator 101 of FIG. 1 surrounding the zero crossing may not be amplified in the output stage 102 of FIG. 1 due to the inherent transmission delay in the power amplifiers. Plots 220 and 230 illustrate the two amplified signals generated from the output stage for the two channels. Zone 250 illustrates the area surrounding zero crossing wherein small modulated pulses may not be translated by the output stage. For example, if the signal pulse received by the output stage was 5 ns and the transmission delay of the output stage is 10 ns, the 5 ns pulse will not be transmitted to the output terminal of the output stage. This will result in distortion. Plot 240 illustrates the signal generated by low pass filter 103 in FIG. 1. Due to the missing pulse widths in output signals 230 and 240, a point of discontinuity in the output waveform exists. This output distortion is illustrated by the flat area 241. This discontinuity, also known as crossover distortion, may increase the total harmonic distortion and noise of the output signal.

Thus, there is a need for an improved switching amplifier capable of low distortion. The present invention solves these and other problems by providing low distortion switching amplifier circuits and methods.

SUMMARY

Embodiments of the present invention include switching amplifier circuits and methods. In one embodiment, the present invention includes a method for performing switching amplification. The method comprises receiving an analog signal, generating a first pulse width modulated signal on a first terminal, generating a second pulse width modulated signal on a second terminal. If the magnitude of the analog input signal is above a threshold, the first pulse width modulated signal is constant when the second pulse width modulated signal is switching. The second pulse width modulated signal is constant when the first pulse width modulated signal is switching. The first and second pulse width modulated signals converge to a first pulse width when the magnitude of the input signal decreases below the threshold.

In another embodiment, the generating of the first pulse width modulated signal and the second pulse width modulated signal comprise modulating a first and second signal, delaying, and digitally half wave rectifying some interim signals. The first signal is modulated to create a first interim pulse width modulated signal. The second signal is modulated to create a second interim pulse width modulated signal. The second interim pulse width modulated signal is delayed to create a delayed second interim pulse width modulated signal. The first interim pulse width modulated signal is digitally half wave rectified. The delayed second interim pulse width modulated signal is digitally half wave rectified. The first signal and second signal form complimentary signals corresponding to the analog input signal.

In another embodiment, the step of generating the first pulse width modulated signal includes generating a first pulse train comprising pairs of pulses when the analog input signal is above the zero crossing and the magnitude of the analog signal is above the threshold. The step further includes generating a second pulse train comprising single pulses having the first pulse width when the magnitude of the analog input signal is below the threshold. The step of generating the second pulse width modulated signal includes generating a third pulse train comprising pairs of pulses when the analog input signal below the zero crossing and the magnitude of the analog signal is above the threshold. The step further includes generating a fourth pulse train comprising single pulses having the first pulse width when the magnitude of the analog input signal is below the threshold.

In one embodiment, the method further comprises receiving a first interim pulse width modulated signal, receiving a second interim pulse width modulated signal, and delaying the second interim pulse width modulated signal resulting in a delayed second interim pulse width modulated signal.

In one embodiment, the second pulse train is out of phase with the fourth pulse train and the third and fourth pulse trains have a first pulse width.

In one embodiment, the first pulse width is fixed.

In one embodiment, the first and third pulse width modulated signals are digitally half wave rectified pulse width modulated signals.

In another embodiment, the present invention includes a method for performing switching amplification in an amplifier. The method comprises receiving an analog input signal, generating a first pulse width modulated signal, generating a second pulse width modulated signal, delaying, and coupling signals to the output terminal of the amplifier. The step of delaying includes generating a delayed pulse width modulated signal. The step of coupling includes coupling the delayed pulse width modulated signal to a first output terminal of the amplifier and coupling the second pulse width modulated signal to a second output terminal of the amplifier.

In one embodiment, the method further comprises generating several pulse trains. A first pulse train comprised of pairs of pulses corresponding to a first signal is generated. A second pulse train comprised of pairs of pulses corresponding to a second signal is generated. A third pulse train comprised of single pulses is generated. A fourth pulse train comprised of single pulses is generated. The first signal and second signal form complimentary signals corresponding to the analog input signal. The first and second pulse trains are generated when the magnitude of the analog input signal is above the threshold. The third and fourth pulse trains are generated when the analog input signal is below the threshold. The first pulse train, the second pulse train, the third pulse train, and the fourth pulse train are based on the delayed pulse width modulated signal and the second pulse width modulated signal.

In one embodiment, the third pulse train is out of phase with the fourth pulse train.

In one embodiment, the delaying generates a fixed width pulse train. The fixed width pulse train provides a non-zero drive level at a load whenever the input signal is near a crossover point, and in accordance therewith reduces the level of crossover distortion.

In another embodiment, the present invention includes a switching amplifier comprising a first modulation circuit, a second modulation circuit, and a digital circuit. The first modulation circuit is coupled to receive a first input signal. The first modulation circuit generates a first pulse width modulated signal. The second modulation circuit is coupled to receive a second input signal. The second modulation circuit generates a second pulse width modulated signal. The digital circuit is coupled to receive the first pulse width modulated signal and the second pulse width modulated. The digital circuit generates a third pulse width modulated signal and generates a fourth pulse width modulated signal. The first and second input signals form an analog input signal. The third pulse width modulated signal and the fourth pulse width modulated signal converge to a first pulse width as the magnitude of the analog input signal decreases.

In one embodiment, the digital circuit includes a delay cell coupled to delay the second pulse width modulated signal by a time period corresponding to the first pulse width.

In one embodiment, the analog input signal is an audio signal. The first output terminal and second output terminal are coupled to an output stage including a speaker. The transmission delay of the output stage is less than the first pulse width.

In one embodiment, the switching amplifier further comprises a first power amplifier coupled to amplify the first pulse width modulated signal and a second power amplifier coupled to amplify the second pulse width modulated signal. The first pulse width is greater than a transmission delay of at least one of the first power amplifier or the second power amplifier.

Additional embodiments will be evident from the following detailed description and accompanying drawings, which provide a better understanding of the nature and advantages of the present invention.

DETAILED DESCRIPTION

Described herein are techniques for switching amplifiers. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1:
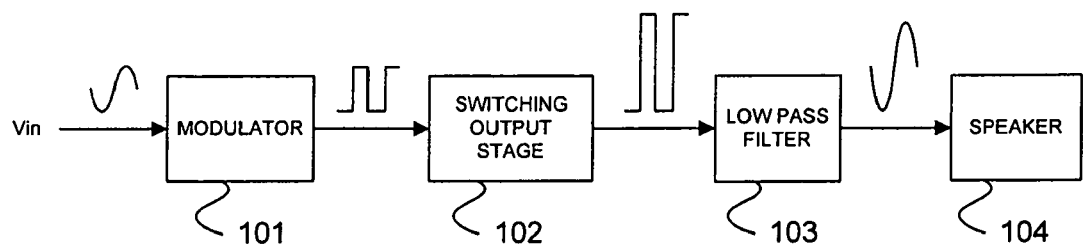
FIG. 1 illustrates a typical switching amplifier.
Figure 2:
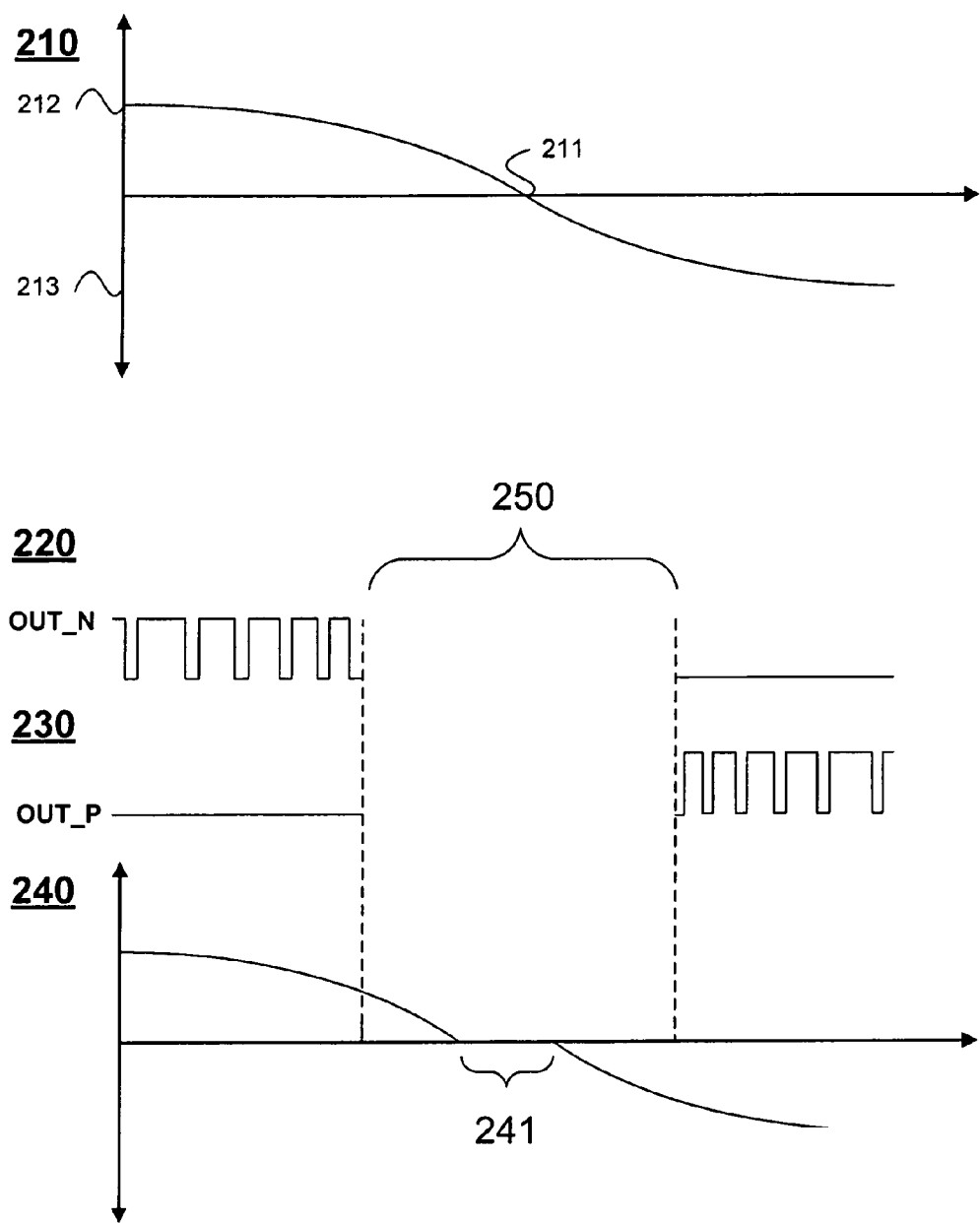
FIG. 2 illustrates a crossover distortion in a switching amplifier.
Figure 3:
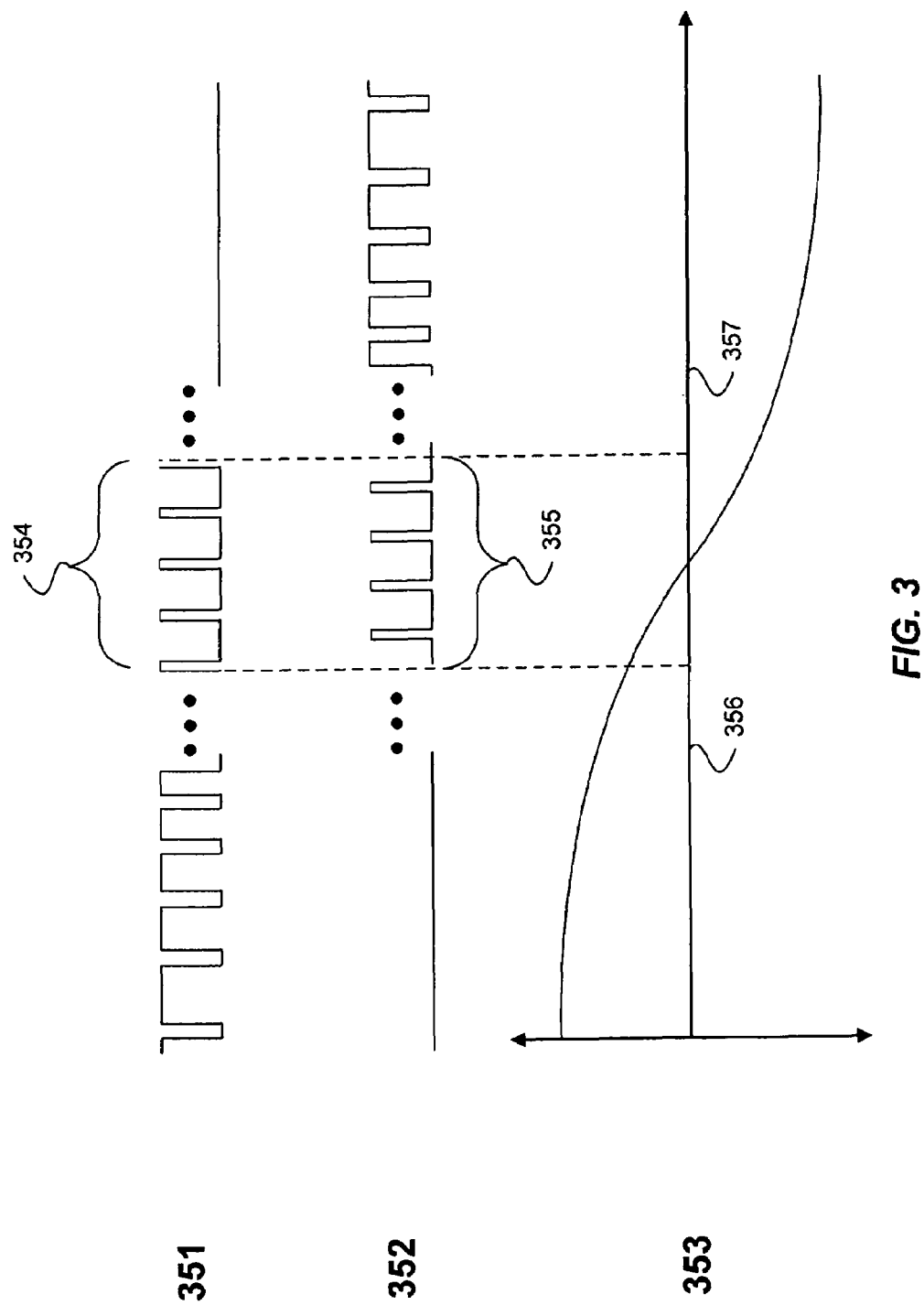
FIG. 3 illustrates a modulation scheme according to one embodiment of the present invention.

FIG. 3 illustrates a modulation scheme according to one embodiment of the present invention. An input analog audio signal is received by a modulator. In one embodiment, the modulator receives a single ended signal. In other embodiments, the modulator may receive a differential audio signal. The modulator translates the input signal into a modulated signal. An example modulation scheme includes pulse width modulation. However, other modulation techniques could be used. After modulation, the modulated signal is amplified by one or more amplifiers. During the amplification stage, small pulses within the modulated signal may be lost due to the inherent transmission delay of the amplifiers. Therefore, input signals of small amplitude may have to overcome crossover distortion when they are amplified by the power amplifiers. Plot 351 illustrates the output from a first channel of a two channel modulator while plot 352 illustrates the output from the second channel. A differential pulse train has been added on both channels near the crossover point as illustrated by 354 and 355. These pulses smooth out the transition at zero crossing, thus resulting in a decrease of total harmonic distortion and noise in the output signal. The idealized analog output signal is shown in plot 353. Because of the pulses, the modulated signal never goes to zero and the distortion surrounding the zero crossing is reduced. In other words, the crossover point is represented by equal duration pulses. The pulses on one output terminal are of equal duration and opposite polarity than the output pulses on the other output terminal at the crossover point. In this example, the pulses are also 180 degrees out of phase. In one embodiment, a delay circuit is used to delay one of the modulated signals so that the modulated representation of the input signal at the crossover point results in a pulses of equal duration on the first and second output terminals. The output terminals may be coupled to a speaker, for example, if the switching amplifier is used in an audio application. Of course, a variety of other applications may benefit from reduced crossover distortion.

Figure 4:
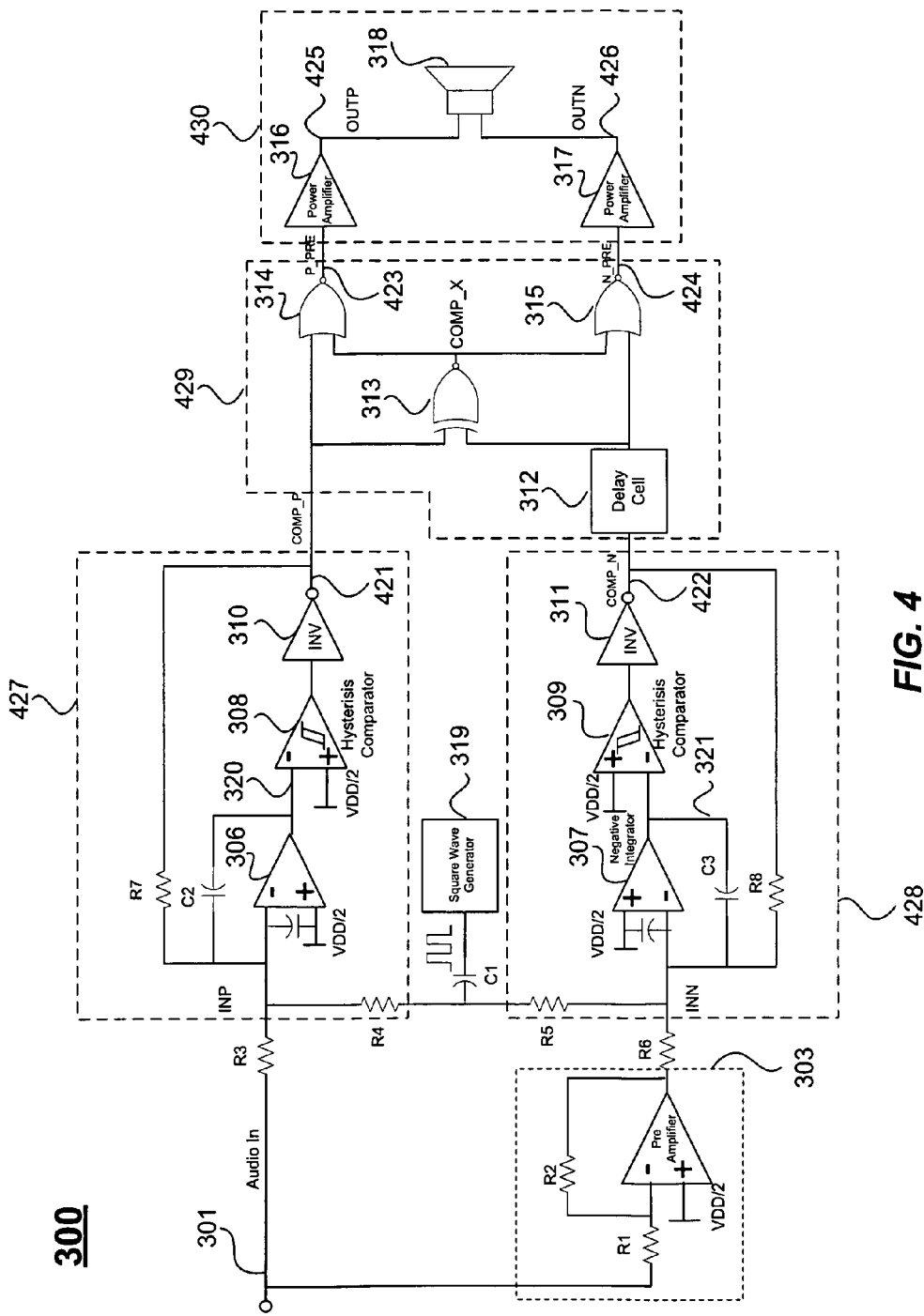
FIG. 4 illustrates a switching amplifier according to one embodiment of the present invention.

FIG. 4 illustrates a switching amplifier 300 according to one embodiment of the present invention. The switching amplifier 300 includes a modulation circuit 427, a modulation circuit 428, a digital circuit 429, an inverter circuit 303, square wave generator circuit 319, and an output stage 430. Modulation circuits 427 and 428 include integrators 306 and 307, comparators 308 and 309, and inverters 310 and 311. The digital circuit 429 includes XNOR gate 313, NOR gates 314 and 315, and delay cell 312. The output stage 430 includes power amplifiers 316 and power amplifier 317. The output stage 430 may also include speaker 318.

An input analog signal 301 is received by circuit 300 and is transmitted to positive integrator 306 and inverter circuit 303. In this example, the input signal 301 is a single ended signal, and inverter circuit 303 may be used to produce an inverse of the input signal. In other embodiments of the present invention, the input signal may be a differential signal, in which case the inverter circuit may be omitted. In this example, the means for modulating the input signal includes two integrators 306 and 307, two comparators 308 and 309, and square wave generator 319. The output of the comparators is coupled through inverters 310 and 311 and a digital circuit. Here, the digital circuit comprised of XNOR 313 and NOR 314 and 315 is digitally half-wave rectifying the pulse width modulated signals to create a modulated representation of a half cycle of the audio signal. A modulated representation of a half cycle of the input signal, positive or negative, is referred to herein as a half-wave rectified modulated signal, or in the case of PWM a half-wave rectified, pulse width modulated signal. This example implementation further includes a delay cell 312 that delays one of the modulated signals so that the modulated signal at the output includes pulses having a minimum duration at the crossover point (e.g., the zero crossing). Accordingly, at the crossover point, the output signal will be pulses having a constant time period. In this example implementation, delay cell 312 is coupled between one of the comparator outputs and the digital circuit input.

Positive integrator 306 may receive the input signal and the output of the square wave generator circuit on the negative input terminal and generate a sawtooth waveform at node 320. The amplitude of the sawtooth waveform is determined by the hysteresis of the comparator 308 while the slope of the sawtooth is determined by the amplitude of the input signal. Hence, it may be said that the sawtooth waveform at node 320 is modulated by the input signal and comparator 308. The sawtooth waveform may then be transmitted to comparator 308 where the comparator performs a pulse width modulation by outputting a low value when the sawtooth waveform is above a certain upper threshold value and outputting a high value when the sawtooth is below a certain lower threshold value. The pulse width modulated signal is then inverted by inverter 310. Similarly, negative integrator 307 receives inverse input analog signal and the output of the square wave generator circuit on the negative input terminal. Integrator 307 receives these inputs and generates a sawtooth waveform at node 321. The sawtooth waveform is then received by comparator 309 wherein the waveform is pulse width modulated.

The pulse width modulated signals located at node 421 and 422 are received by digital circuit comprised of delay cell 312, XNOR 313, and NOR gates 314 and 315. The digital circuit translates the received signals into half-wave rectified, pulse width modulated signals. The signal at node 424 represents the half-wave rectified, pulse width modulated representation of the input analog signal, while the signal at node 423 represents the half-wave rectified, pulse width modulated representation of the inverted input analog signal. Delay cell 312 coupled to node 322 illustrates one method of generating a differential pulse train to reduce crossover distortion. Delay cell 312 delays the received signal by a fixed amount of time. When combined with the combination logic of the digital circuit, differential pulse trains may be generated at nodes 423 and 424 near zero crossing. The delay time results in a pulse train near zero crossings to reduce the crossover distortion near the zero crossing. This results in lower total harmonic distortion and noise in the speaker. In another embodiment, delay cell 312 is coupled between node 421 and NOR 314. The half-wave rectified, pulse width modulated signals are then received by power amplifiers 316 and 317 where the signals are amplified and transmitted to speaker 318. The circuit may also include feedback as disclosed in U.S. patent application Ser. No. 11/890,813 entitled "Low Distortion Switching Amplifier Circuits and Methods," filed on Aug. 7, 2007, naming Hideto Takagishi, Wolf Zhang, and Alan Wu as inventors the entire disclosure of which is hereby incorporated herein by reference.

Figure 5:
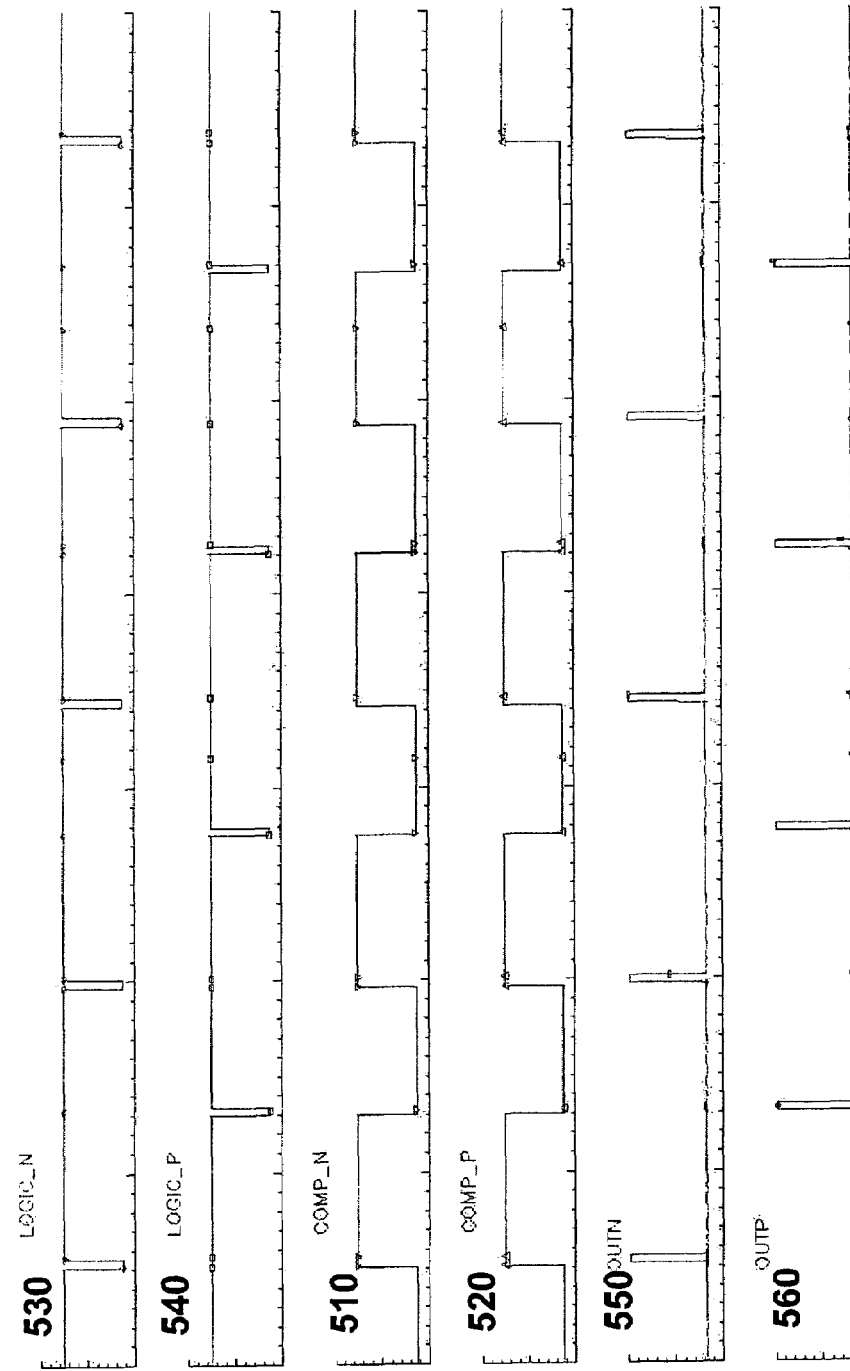
FIG. 5 illustrates waveforms in the switching amplifier of FIG. 4 when there is no input signal.

FIG. 5 illustrates waveforms in the switching amplifier of FIG. 4 when there is no input signal. Pulse width modulation of an empty input signal will result in a square waveform of 50 percent duty cycle. Plot 510 illustrates the pulse width modulated signal located at node 422 of FIG. 4 while plot 520 illustrates the pulse width modulated signal located at node 421 of FIG. 4. The two waveforms are identical, therefore the half-wave rectified, pulse width modulated signals received by the power amplifiers will also be flat if the delay cell was not present. With delay cell 312 of FIG. 4, plot 510 shifts to the right by an amount equal to the fixed delay time of delay cell 312. This will result in differential fixed width pulse trains generated at nodes 423 and 424 of FIG. 4. These fixed width pulse trains may be generated whenever the incoming signal is near zero. Plot 530 illustrates the waveform located at node 424 of FIG. 4 and plot 540 illustrates the waveform located at node 423 of FIG. 4. Plot 550 illustrates the amplified signal at node 426 and plot 560 illustrates the amplified signal at node 425. When plots 550 and 560 are compared to plots 530 and 540 respectively, the waveforms are inverted copies of one another. This demonstrates that the pulse widths have in fact been translated by power amplifiers 316 and 317 of FIG. 4. These pulse trains may be used to drive the output whenever the input signal is near a crossover point.

Figure 6:
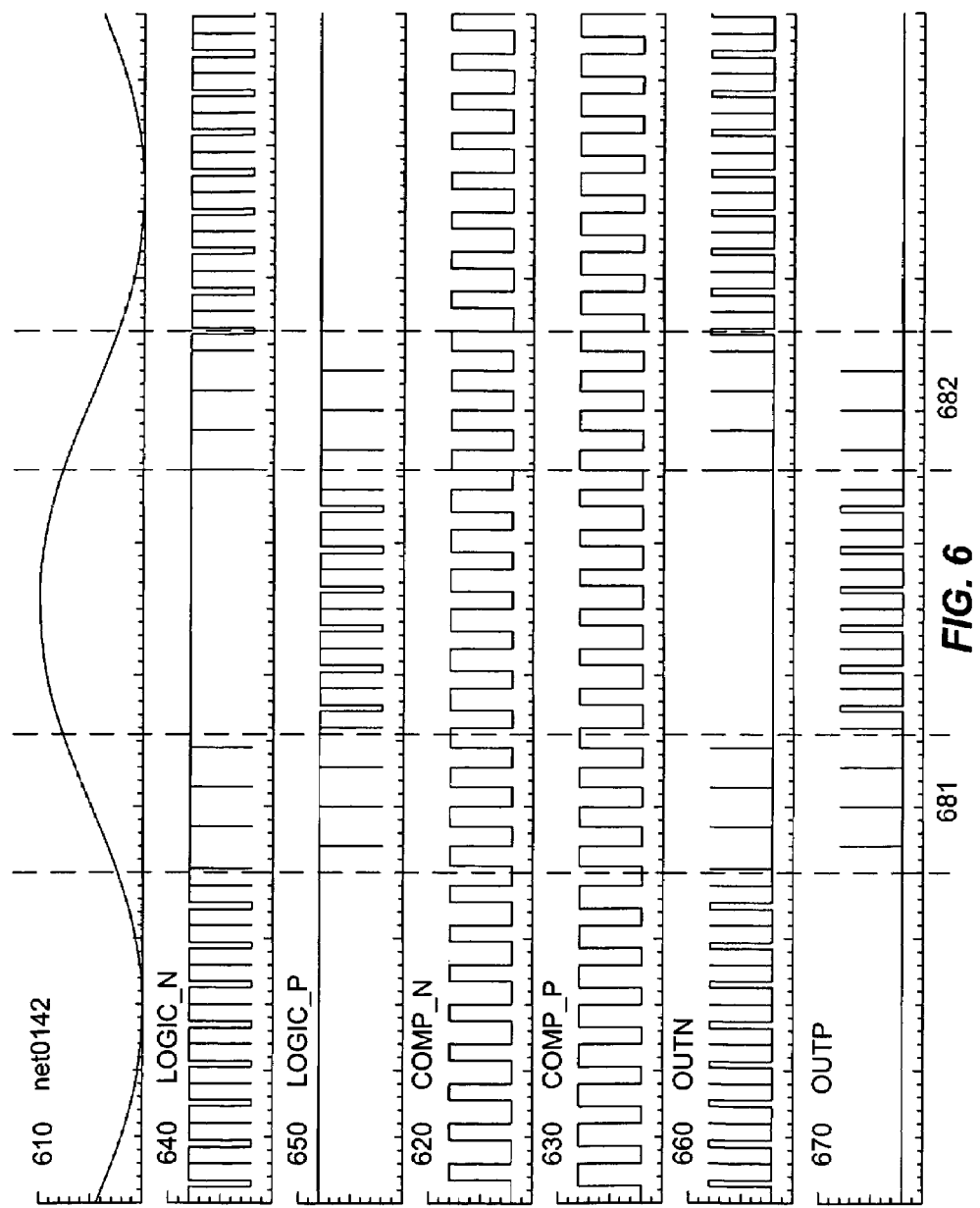
FIG. 6 illustrates waveforms in the switching amplifier of FIG. 4 when the input signal is a sine wave.

FIG. 6 illustrates waveforms in the switching amplifier of FIG. 4 when the input signal is a sine wave. The input signal is shown in plot 610. Plot 620 illustrates the pulse width modulated signal at node 422 of FIG. 4 and plot 630 illustrates the pulse width modulated signal located at node 421 of FIG. 4. Combinational logic 313 through 315 of FIG. 4 is equivalent to the subtraction of the waveforms in plot 620 and 630. Node 423 is equivalent to the subtraction between plot 630 and plot 620 while node 424 is equivalent to the subtraction between plot 620 and plot 630. Near zero crossing, the subtraction may result in narrow pulse widths or no pulse widths at all. If the pulse widths are too narrow, they may not be translated by the power amplifier. The delay in delay cell 312 of FIG. 4 shifts plot 620 to the right by a fixed amount. Accordingly, pulse widths near zero crossing may be set to a minimum duration sufficient to overcome the transition delay of the power amplifiers. Plot 640 illustrates the half-wave rectified, pulse width modulated signal at node 424 and plot 650 illustrates the half-wave rectified, pulse width modulated signal at node 423. Both plots contain pulse trains within the zero crossing zones illustrated by 681 and 682. Plot 660 illustrates the waveform of plot 640 after it is translated by power amplifier 317. As shown, the pulse trains within the zero crossing zone have been translated by the power amplifier. Similarly, plot 670 illustrates the waveform of plot 650 after it is translated by power amplifier 316. Here, the pulse trains within the zero crossing zone have also been translated by the power amplifier. The translation of those pulse widths by the power amplifier reduces the crossover distortion at zero crossing due to the transition delay of the power amplifier, therefore resulting in a decrease in the total harmonic distortion and noise in the circuit.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, switching amplifier circuits and methods according to the present invention may include some or all of the innovative features described above. Based on the above disclosure and the following claims, other arrangements, embodiments, implementations and equivalents will be evident to those skilled in the art and may be employed without departing from the spirit and scope of the invention as defined by the claims.

What is claimed is:

1. A method of performing switching amplification, the method comprising:
    receiving an analog input signal;
    generating a first pulse width modulated signal; and
    generating a second pulse width modulated signal,
    wherein if the magnitude of the analog input signal is above a threshold, the first pulse width modulated signal is constant when the second pulse width modulated signal is switching and the second pulse width modulated signal is constant when the first pulse width modulated signal is switching,
    wherein the first and second pulse width modulated signals converge to a first pulse width when the magnitude of the input signal decreases below the threshold.

2. The method of claim 1, the generating of the first pulse width modulated signal and the second pulse width modulated signal comprising:
    modulating a first signal to create a first interim pulse width modulated signal;
    modulating a second signal to create a second interim pulse width modulated signal;
    delaying the second interim pulse width modulated signal to create a delayed second interim pulse width modulated signal;
    digitally half wave rectifying the first interim pulse width modulated signal; and
    digitally half wave rectifying the delayed second interim pulse width modulated signal,
    wherein the first signal and second signal form complimentary signals corresponding to the analog input signal.

3. The method of claim 1 wherein the generating the first pulse width modulated signal includes generating a first pulse train comprising pairs of pulses when the analog input signal is above a zero crossing and a magnitude of the analog signal is above the threshold, and generating a second pulse train comprising single pulses having the first pulse width when the magnitude of the analog input signal is below the threshold, and
    wherein the generating the second pulse width modulated signal includes generating a third pulse train comprising pairs of pulses when the analog input signal below the zero crossing and the magnitude of the analog signal is above the threshold, and generating a fourth pulse train comprising single pulses having the first pulse width when the magnitude of the analog input signal is below the threshold.

4. The method of claim 3 further comprising:
    receiving a first interim pulse width modulated signal;
    receiving a second interim pulse width modulated signal; and
    delaying the second interim pulse width modulated signal resulting in a delayed second interim pulse width modulated signal.

5. The method of claim 3 wherein the second pulse train is out of phase with the fourth pulse train and the third and fourth pulse trains have a first pulse width.

6. The method of claim 1 wherein the first pulse width is fixed.

7. The method of claim 1 wherein the first and third pulse width modulated signals are digitally half wave rectified pulse width modulated signals.

8. A method for performing switching amplification in an amplifier, the method comprising:
    receiving an analog input signal;
    generating a first pulse width modulated signal;
    generating a second pulse width modulated signal;
    delaying the first pulse width modulated signal to generate a delayed pulse width modulated signal;
    coupling the delayed pulse width modulated signal to a first output terminal of the amplifier; and
    coupling the second pulse width modulated signal to a second output terminal of the amplifier,
    wherein the delaying generates a fixed width pulse train, and
    wherein the fixed width pulse train provides a non-zero drive level at a load if the input signal is near a crossover point, and in accordance therewith, reduces the level of crossover distortion.

9. The method of claim 8 further comprising:
    digitally half wave rectifying the delayed first pulse width modulated signal; and
    digitally half wave rectifying the second pulse width modulated signal.

10. The method of claim 8 further comprising:
    generating a first pulse train comprising pairs of pulses corresponding to a first signal;
    generating a second pulse train comprising pairs of pulses corresponding to a second signal;
    generating a third pulse train comprising single pulses; and
    generating a fourth pulse train comprising single pulses,
    wherein the first signal and second signal form complimentary signals corresponding to the analog input signal,
    wherein the first and second pulse trains are generated when the magnitude of the analog input signal is above the threshold and the third and fourth pulse trains are generated when the analog input signal is below the threshold, wherein the first pulse train, the second pulse train, the third pulse train, and the fourth pulse train are based on the delayed first pulse width modulated signal and the second pulse width modulated signal.

11. The method of claim 10 wherein the third pulse train is out of phase with the fourth pulse train.

12. A switching amplifier comprising:

a first modulation circuit coupled to receive a first input signal, the first modulation circuit generating a first pulse width modulated signal;

a second modulation circuit coupled to receive a second input signal, the second modulation circuit generating a second pulse width modulated signal;

a digital circuit coupled to receive the first pulse width modulated signal and the second pulse width modulated, the digital circuit generating a third pulse width modulated signal and generating a fourth pulse width modulated signal, wherein the first and second input signals form an analog input, wherein the third pulse width modulated signal and the fourth pulse width modulated signal converge to a first pulse width as the magnitude of the analog input signal decreases.

13. The switching amplifier of claim 12 wherein the third pulse width modulated signal is a half wave rectified pulse width modulated signal and the fourth pulse width modulated signal is a half wave rectified pulse width modulated signal.

14. The switching amplifier of claim 12 wherein the digital circuit includes a delay cell coupled to delay the second pulse width modulated signal by a time period corresponding to the first pulse width.

15. The switching amplifier of claim 12 further comprising a square wave generator having an output which provides a pulse wave having a duty cycle, wherein the first modulation circuit receives the pulse wave and the first input signal and generates a first sawtooth waveform corresponding to the first input signal, wherein the second modulation circuit receives the pulse wave and the second input signal and generates a second sawtooth waveform corresponding to the second input signal.

16. The switching amplifier of claim 15 wherein the duty cycle is fifty percent.

17. The switching amplifier of claim 12 wherein the analog input signal is an audio signal and the first output terminal and second output terminal are coupled to an output stage including a speaker, wherein the transmission delay of the output stage is less than the first pulse width.

18. The switching amplifier of claim 12 further comprising:

a first power amplifier coupled to amplify the first pulse width modulated signal; and a second power amplifier coupled to amplify the second pulse width modulated signal, wherein the first pulse width is greater than a transmission delay of at least one of the first power amplifier or the second power amplifier.

19. The switching amplifier of claim 12 wherein the first pulse width modulated signal is coupled to a first output terminal, wherein the second pulse width modulated signal is coupled to a second output terminal, and wherein the analog input signal is an audio signal and the first output terminal and the second output terminal are coupled to drive a speaker.

* * * * *